(12) United States Patent
Sairiala et al.

(10) Patent No.: US 11,946,968 B2
(45) Date of Patent: Apr. 2, 2024

(54) DIAGNOSIS OF MOBILE DEVICES USING BUILT-IN ACTUATORS AND SENSORS

(71) Applicant: Blancco Technology Group IP Oy, Joensuu (FI)

(72) Inventors: Timo Sairiala, Joensuu (FI); Sami Gerdt, Joensuu (FI); Markku Valtonen, Joensuu (FI)

(73) Assignee: BLANCCO TECHNOLOGY GROUP IP OY, Joensun (FI)

( * ) Notice: Subject to any disclaimer, the term of this patent is extended or adjusted under 35 U.S.C. 154(b) by 341 days.

(21) Appl. No.: 17/293,855

(22) PCT Filed: Sep. 19, 2019

(86) PCT No.: PCT/FI2019/050669
§ 371 (c)(1),
(2) Date: May 13, 2021

(87) PCT Pub. No.: WO2020/115354
PCT Pub. Date: Jun. 11, 2020

(65) Prior Publication Data
US 2022/0018895 A1   Jan. 20, 2022

(30) Foreign Application Priority Data
Dec. 5, 2018   (FI) ........................... 20186053

(51) Int. Cl.
*G01R 31/28* (2006.01)
*H04M 1/24* (2006.01)
*H04R 29/00* (2006.01)

(52) U.S. Cl.
CPC ..... *G01R 31/2834* (2013.01); *G01R 31/2825* (2013.01); *G01R 31/2829* (2013.01);
(Continued)

(58) Field of Classification Search
CPC ................. G01R 31/28; G01R 31/2825; G01R 31/2829; G01R 31/2834; G01R 31/2836;
(Continued)

(56) References Cited

U.S. PATENT DOCUMENTS

2011/0301870 A1   12/2011   Tam et al.
2012/0029947 A1   2/2012   Alexander et al.

FOREIGN PATENT DOCUMENTS

| CN | 104754094 | 7/2015 | |
|----|-----------|--------|--|
| EP | 3367645 A1 * | 8/2018 | ............ G06F 11/006 |

(Continued)

OTHER PUBLICATIONS

International Preliminary Report on Patentability issued in PCT/FI2019/050669 dated Jul. 8, 2020.
(Continued)

*Primary Examiner* — Jermele M Hollington
*Assistant Examiner* — Courtney G McDonnough
(74) *Attorney, Agent, or Firm* — DICKINSON WRIGHT PLLC

(57) ABSTRACT

According to an aspect, there is provided a method for self-diagnosing a mobile device comprising at least one or more actuators, one or more sensors and a display. The method comprises, first, feeding a pre-defined control signal to a first actuator of the mobile device and measuring, in response to the feeding, a first electric signal using a first sensor of the one or more sensors. Then, the first electric signal is compared to one or more reference signals associated with the first actuator and the pre-defined control signal. If the first electric signal fails to match the one or more reference signals according to one or more pre-defined criteria, a negative diagnosis is indicated to a user of the mobile device using one or more of a display of the mobile device and one or more actuators of the mobile device.

19 Claims, 8 Drawing Sheets

(52) U.S. Cl.
CPC .......... *G01R 31/2836* (2013.01); *H04M 1/24* (2013.01); *H04R 29/001* (2013.01); *H04M 2250/12* (2013.01)

(58) Field of Classification Search
CPC .. H04M 1/24; H04M 1/0287; H04M 2250/12; H04R 29/00; H04R 29/001; H04R 29/004; G01P 21/00; G06Q 10/20
USPC ........................................................ 324/537
See application file for complete search history.

(56) References Cited

FOREIGN PATENT DOCUMENTS

| EP | 3367645 A1 | 8/2018 |
|---|---|---|
| JP | 2014176000 | 9/2014 |
| WO | 2013153590 | 10/2013 |

OTHER PUBLICATIONS

Japanese Office Action dated Aug. 29, 2023 (Aug. 29, 2023), 9 pages, issued on related Japanese patent application 2021-232161 by the Japanese Patent Office.

Decision to Grant a Patent dated Dec. 7, 2023 (Dec. 7, 2023), 3 pages (1 page Japanese Decision, 2 pages English Translation) issued on related Japanese Patent Application 2021-532161 by the Japan Patent Office.

\* cited by examiner

DIAGNOSIS OF MOBILE DEVICES USING BUILT-IN ACTUATORS AND SENSORS

CROSS-REFERENCE TO RELATED APPLICATIONS

This application is a national stage application of PCT/FI2019/050669, filed on Sep. 19, 2019, entitled "Diagnosis of Mobile Devices Using Built-In Actuators and Sensors". PCT/FI2019/050669 claims priority to Finland Application No. 20186053, filed on Dec. 5, 2018. Both applications are hereby incorporated by reference in their entireties for all purposes.

TECHNICAL FIELD

Various example embodiments relate to diagnosis of mobile devices.

BACKGROUND

Being able to perform diagnostics (i.e., diagnosis process) of a mobile device reliably and efficiently is essential for deciding on the potential reuse of a used mobile device. Completely or partially non-functional devices may not be reused for their original purpose without first repairing them. Since further processing and shipping of non-functional devices may not be economical, it is important that such devices are diagnosed swiftly and accurately at an early stage.

Typically, diagnostics of mobile devices require some input from a human operator. For example, human input may be required to operate the device in order to initiate the diagnosis process and/or to judge whether output (e.g., an audio signal) produced by the mobile device is as expected. This type of diagnosis requiring manual work is time-consuming and prone to errors as different human operators may have different opinion on whether the mobile device works as expected based on a given output. Therefore, there is a need for a more automatic solution for diagnosing mobile devices.

BRIEF DESCRIPTION

According to an aspect, there is provided the subject matter of the independent claims. Some further embodiments are defined in the dependent claims.

One or more examples of implementations are set forth in more detail in the accompanying drawings and the description below. Other features will be apparent from the description and drawings, and from the claims.

Some embodiments provide a method, an apparatus and a computer readable medium for self-diagnosing a mobile device.

BRIEF DESCRIPTION OF DRAWINGS

In the following, example embodiments will be described in greater detail with reference to the attached drawings, in which.

DETAILED DESCRIPTION OF SOME EMBODIMENTS

The following embodiments are only presented as examples. Although the specification may refer to "an", "one", or "some" embodiment(s) and/or example(s) in several locations of the text, this does not necessarily mean that each reference is made to the same embodiment(s) or example(s), or that a particular feature only applies to a single embodiment and/or example. Single features of different embodiments and/or examples may also be combined to provide other embodiments and/or examples.

Figure 1A:
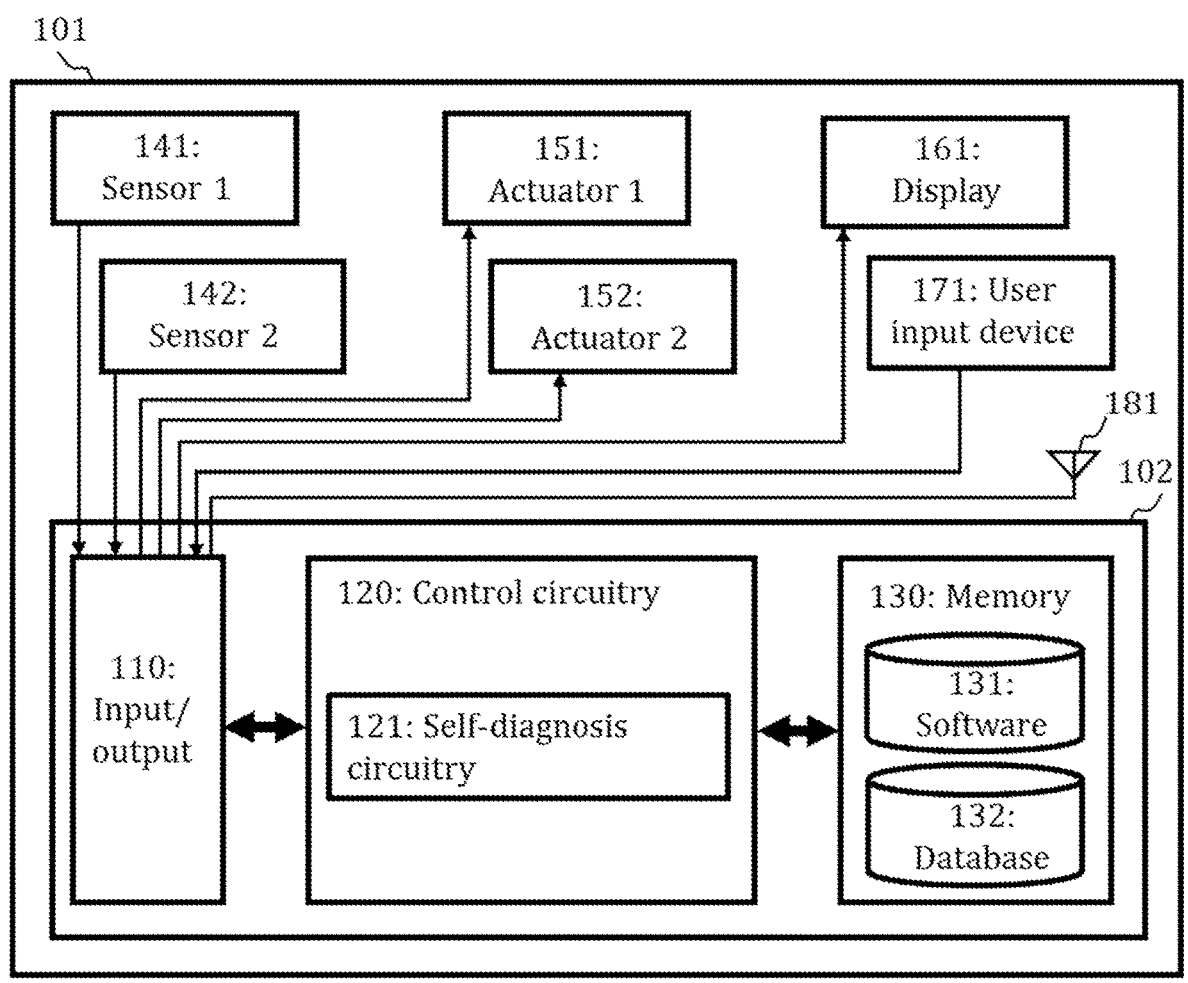
FIGS. 1A and 1B illustrate apparatuses according to embodiments.

FIG. 1A illustrates an apparatus 101 according to embodiments. Specifically, the apparatus 101 may be a mobile device. Each mobile device according to embodiments comprises at least processing means 102, one or more actuators 151, 152, one or more sensors 141, 142 and a display 161. Optionally, each mobile device 101 may also comprise a user input device 171 and one or more antennas 181.

The mobile device 101 may be a user device (also called UE, user equipment, user terminal, terminal device, etc.). The user device may be a portable computing device that includes wireless mobile communication devices operating with or without a subscriber identification module (SIM), including, but not limited to, the following types of devices: a mobile station (mobile phone), a smartphone, a personal digital assistant (PDA), a handset, a device using a wireless modem (alarm or measurement device, etc.), a laptop, a touch screen computer, a tablet, a (portable) game console, a notebook, and a multimedia device. It should be appreciated that a user device may also be a nearly exclusive uplink only device, of which an example is a camera or video camera loading images or video clips to a network. A user device may also be a device having capability to operate in Internet of Things (IoT) network which is a scenario in which objects are provided with the ability to transfer data over a network without requiring human-to-human or human-to-computer interaction. In some embodiments, the mobile device may be an offline portable computing device.

The mobile device may be configured for operation in a communications system employing one or more of the following technology architectures: long term evolution advanced (LTE Advanced, LTE-A), new radio (NR, 5G), the universal mobile telecommunications system (UMTS) radio access network (UTRAN or E-UTRAN), long term evolution (LTE, the same as E-UTRA), wireless local area network (WLAN or WiFi), worldwide interoperability for microwave access (WiMAX), Bluetooth®, personal communications services (PCS), ZigBee®, wideband code division multiple access (WCDMA), systems using ultra-wideband (UWB) technology, sensor networks, mobile ad-hoc networks (MANETs) and Internet Protocol multimedia subsystems (IMS) or any combination thereof.

The one or more actuators 151, 152 may comprise, for example, one or more actuators of one or more of the following types: a loudspeaker and a vibrator. The loudspeaker (or simply speaker) may be any electroacoustic transducer configured to convert an electric acoustic or audio signal into a corresponding sound. For example, the loudspeaker may be a piezoelectric speaker using the piezoelectric effect for generating sound or a dynamic speaker using electromagnetic induction to do the same. The vibrator may be any component providing a haptic feedback, such as an eccentric rotating mass (ERM), a linear resonant actuator (LRA), a piezoelectric actuator, a forced impact-based haptic actuator (equally called an accelerated ram-based haptic actuator) or an Apple Taptic Engine. For example, the haptic feedback may be provided by a (small) electric motor placed inside the body of the mobile device such that when operational the electric motor causes the vibrator and as a consequence also the mobile device to vibrate. To achieve sufficient vibration, the (small) electric motor may be connected to an off-center weight. The vibrator may be used, for example, to provide a vibrating alert functionality or a haptic feedback functionality for the mobile device. The one or more actuators 151, 152 may be built-in actuators of the mobile device 101.

The one or more sensors 141, 142 may comprise, for example, one or more sensors of one or more of the following types: a microphone and an accelerometer. The microphone may be any transducer converting sound into an electric signal. For example, the microphone may be a dynamic microphone, which uses a coil of wire suspended in a magnetic field, a condenser microphone, which uses a vibrating diaphragm as a capacitor plate or a piezoelectric microphone, which uses a crystal of piezoelectric material. In some embodiments, a loudspeaker (as discussed in the previous paragraph) may be used "in reverse" also as a microphone. The accelerometer (i.e., an acceleration sensor) may be any device which measures acceleration (or specifically proper acceleration). Preferably, the accelerometer is a digital sensor. The accelerometer may be a single- and multi-axis accelerometer capable of detecting at least magnitude of the acceleration (and optionally also direction of the acceleration). The accelerometer may be, for example, a capacitive micro-electro-mechanical systems (MEMS) accelerometer, piezoresistive accelerometer, piezoelectric accelerometer, charge mode piezoelectric accelerometer and voltage mode internal electronic piezoelectric (IEPE) accelerometer. The accelerometer is the most commonly used example of a vibration sensor (i.e., a sensor sensing vibrations). Other vibration sensors may also be used instead of acceleration sensors. The one or more sensors 141, 142 may be built-in sensors of the mobile device.

As described above and also illustrated in FIG. 1A, the one or more actuators 151, 152 and the one or more sensors 141, 142 may be comprised in the mobile device 101 (i.e., they may be built-in elements of the mobile device 101), in some other embodiments one or more of the one or more actuators 151, 152 and the one or more sensors 141, 142 may be external to the mobile device 101 connectable to it, for example, wirelessly or using a cable.

The user input device 171 enables the user of the mobile device to issue commands to the processing means 102. The user input device 171 may comprise, for example, one or more of a keypad, a set of one or more pushbuttons, a touchpad, a control stick and a touchscreen (or one or more sensors of the touchscreen). If the user input device 171 is a touch screen, the user input device 171 and the display 161 may form a single entity or device, as opposed to them being separate entities as shown in FIG. 1A.

The display 161 may be any electric visual display employing, for example, one or more of electroluminescent (EL) technology, liquid crystal (LQ) technology, light emitting diode (LED) technology (including more advanced organic LED technology and active-matrix organic LED technology, plasma technology and/or quantum dot (QD) technology. The display 161 may be a touchscreen, as described in the previous paragraph. Specifically, the display may be capacitive touchscreen, a resistive touch screen or a touchscreen employing some other technology such as surface acoustic wave technology. In some embodiments, two or more displays may be comprised in the mobile device 101.

The processing means 102 (equally called just the means) may be configured to carry out the diagnosis processes according to any embodiments to be discussed below in communication with at least the one or more sensors 141, 142 and the one or more actuators 151, 152 and optionally also with the display 161 and the user input device 171. The processing means may comprise one or more control circuitry 120, such as at least one processor, and at least one memory 130, including one or more algorithms 131, such as a computer program code (software) wherein the at least one memory and the computer program code (software) are configured, with the at least one processor, to cause the processing means or the mobile device to carry out any one of the exemplified functionalities of the mobile device or processing means to be described below (specifically in relation to FIGS. 2 to 6, 7A and 7B). Said at least one memory 130 may also comprise at least one database 132.

The control circuitry 120 of the processing means comprise at least self-diagnosis circuitry 121 which is configured to perform self-diagnosis (or self-diagnostics) of the mobile device according to embodiments. To this end, the self-diagnosis circuitry 121 is configured to carry out functionalities to be described below by means of any of FIGS. 2 to 6, 7A and 7B using one or more individual circuitries.

Referring to FIG. 1A, the memory 130 may be implemented using any suitable data storage technology, such as semiconductor based memory devices, flash memory, magnetic memory devices and systems, optical memory devices and systems, fixed memory and removable memory.

Referring to FIG. 1A, the processing means 102 may further comprise different interfaces or inputs/outputs 110 such as one or more communication interfaces comprising hardware and/or software for realizing communication connectivity according to one or more communication protocols using the one or more antennas 181. The one or more interfaces 110 may provide inputs for receiving signals from the one or more sensor 141, 142 and the user input device 171 and outputs for feeding signals to the one or more actuators 151, 152 and the display 161. The one or more interfaces 110 may provide the mobile device with communication capabilities via the one or more antennas 181 to communicate in a cellular communication system and enable communication between user devices (i.e., terminal devices) and different network nodes or elements and/or a communication interface to enable communication between different network nodes or elements, for example. The one or more interfaces 110 may comprise standard well-known components such as an amplifier, filter, frequency-converter, (de)modulator, analog-to-digital converters (ADC), digital-to-analog converters (DAC) and encoder/decoder circuitries, controlled by the corresponding controlling units.

Some further example (processing) means for carrying out any of the processes to be discussed in relation to FIGS. 2 to 6, 7A and 7B according to embodiments may comprise at least one of the following: detector, processor (including dual-core and multiple-core processors), digital signal processor, controller, receiver, transmitter, encoder, decoder, memory, RAM, ROM, software, firmware, display, user interface, display circuitry, user interface circuitry, user interface software, display software, circuit, antenna, antenna circuitry, and circuitry. In an embodiment, the at least one processor, the memory, and the computer program code form processing means or comprises one or more computer program code portions for carrying out one or more operations according to any one of the embodiments of FIGS. 2 to 6, 7A and 7B or operations thereof. The means may further comprise, in some embodiments, one or more of the one or more actuators, the one or more sensors, a display and a user input device, as described above.

As used in this application, the term 'circuitry' may refer to one or more or all of the following: (a) hardware-only circuit implementations, such as implementations in only analog and/or digital circuitry, and (b) combinations of hardware circuits and software (and/or firmware), such as (as applicable): (i) a combination of analog and/or digital hardware circuit(s) with software/firmware and (ii) any portions of hardware processor(s) with software, including digital signal processor(s), software, and memory(ies) that work together to cause an apparatus, such as a mobile device, to perform various functions, and (c) hardware circuit(s) and processor(s), such as a microprocessor(s) or a portion of a microprocessor(s), that requires software (e.g. firmware) for operation, but the software may not be present when it is not needed for operation. This definition of 'circuitry' applies to all uses of this term in this application, including any claims. As a further example, as used in this application, the term 'circuitry' also covers an implementation of merely a hardware circuit or processor (or multiple processors) or a portion of a hardware circuit or processor and its (or their) accompanying software and/or firmware. The term 'circuitry' also covers, for example and if applicable to the particular claim element, a baseband integrated circuit for a terminal device or other computing or network device.

Figure 1B:
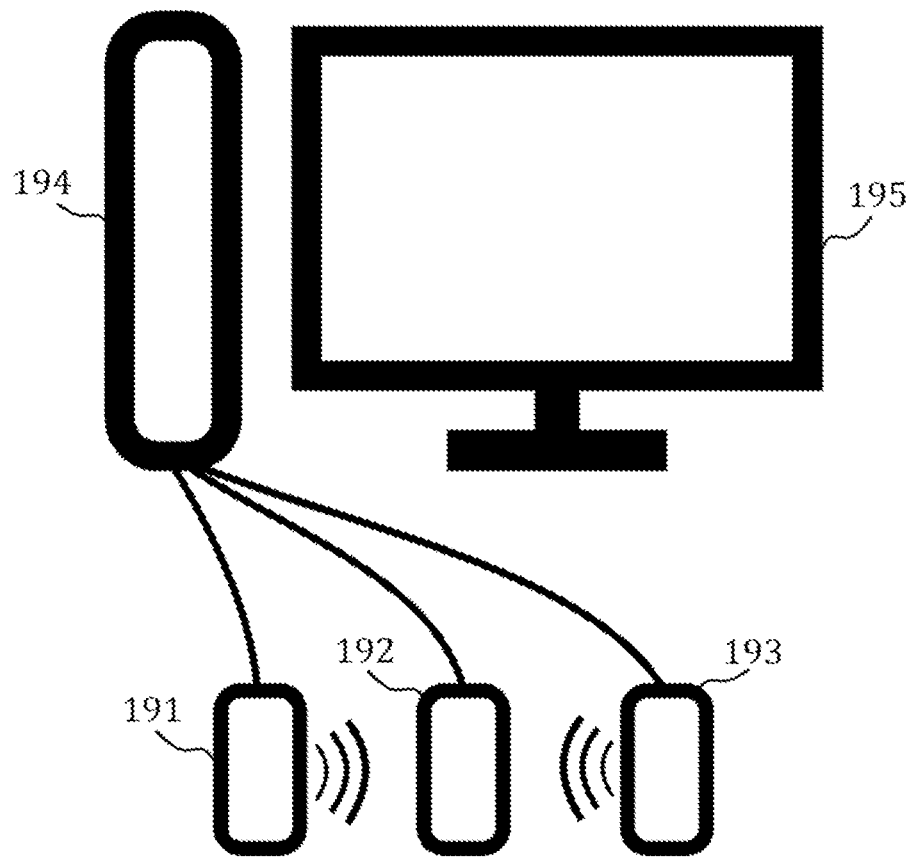

FIG. 1B illustrates an exemplary system according to embodiments. Specifically, the illustrated system comprises three mobile devices 191, 192, 193 and a computing device 194 connected to each of them via wired or wireless communication links (in the illustrated example, wired communication links are depicted). In other embodiments, a different number of mobile devices (one or more mobile devices) may be included in the system.

Each mobile device 191, 192, 193 may be a mobile device 101 of FIG. 1A as described above. The mobile devices 191, 192, 193 (or at least some of them) may be located in close proximity of each other so that at least some of the signals produced by at least one actuator (e.g., a loudspeaker) of a first mobile device 191, 193 may be measured using at least one sensor of a second mobile device 192. The mobile devices may be able to communicate with each other via wireless communication links (using, e.g., Bluetooth).

The computing device 194 which comprises a display 195 may be used to monitor the processes carried out by the mobile devices 191, 192, 193. To this end, the mobile devices 191, 192, 193 may be configured to transmit information on the analysis processes (e.g., diagnosis results and/or any associated intermediate results) carried out by them in real time or at least periodically. The computing device 194 may be, for example, a desktop computer.

Being able to perform diagnostics of a mobile device, such as the ones discussed in relation to FIGS. 1A and 1B, reliably and efficiently is essential for deciding on the potential reuse of a used mobile device. Completely or partially non-functional devices need to be repaired at a cost before reuse for their original purpose is possible. Since further processing and shipping of non-functional devices may not be economical, it is important that such devices are diagnosed swiftly and accurately at an early stage.

Typically, performing diagnostics of mobile devices requires some input from a human operator. For example, human input may be required to operate the device to initiate the diagnosis process and/or to judge whether output (e.g., an audio signal or a vibration of the mobile device) produced by the mobile device is as expected. This type of diagnosis requiring manual work is time-consuming and prone to errors as different human operators may have different opinion on whether the mobile device works as expected based on a given output.

Diagnostics tests that require human interaction comprise, for example, a vibrator test, a loudspeaker test and an accelerometer test. In an example of the vibrator test, the mobile device spins its vibrator motor and requests the human operator to pick up the phone and provide input on whether or not the mobile device is vibrating. In an example of the loudspeaker test, the mobile device plays a predefined sound from each loudspeaker in turn and requests the human operator to provide input on whether or not the sound was or is audible. In an example of the accelerometer test, the human operator is requested to move the mobile device in some (arbitrary) manner while the mobile device reads values from its accelerometer sensor(s).

During the aforementioned tests, one or more fault conditions may be detected. For example, the vibrator motor may run only periodically or uncontrollably in the vibrator test, the sound which is heard during the loudspeaker test may be different than expected or it may be of low quality and/or the accelerometer sensor(s) may provide nonsensical values when the mobile device moved in the accelerometer test.

While the diagnostic tests requiring human operators may be considered reasonably dependable in most circumstances, the human interaction dependent diagnostics is often slow and error-prone compared to automated diagnostics. This typically causes a bottleneck in processing facilities for the secondhand devices, as a single operator usually works on multiple devices at any time.

The disadvantages of the human interaction dependent diagnostics relate to loss of time and lack of reliability, as described in detail, respectively, in the following two paragraphs.

When human interaction is required for fully carrying out the diagnosis process, the mobile device may spend a significant amount of time in a state where it is waiting for human input as the human operator may be busy operating on another mobile device or may just not notice that a human input is needed. Modern mobile devices may have multiple microphones and multiple loudspeakers to test. Considering one test involving a human operator may take 10 seconds, it may easily take one minute to test all the microphones and loudspeakers in a single mobile device. In contrast, an automated test covering all these components could be easily run in 10 seconds.

When the operator is requested to judge whether the device is performing as expected, the result is always subject to bias. For example, the operator may be satisfied with lower volume or sound quality than another operator. Further, sounds originating from any adjacent devices may be mixed with sounds coming from the mobile device under diagnosis. In addition, the mobile device may be defected causing one or more sensors of the mobile device to provide faulty values.

The embodiments such as the one illustrated in FIG. 1A and to be discussed below overcome at least some of the problems outlined above. Specifically, the embodiments provide a fully (or at least predominantly) automatic means for performing diagnostics of the mobile device as shown in FIG. 1A.

Figure 2:
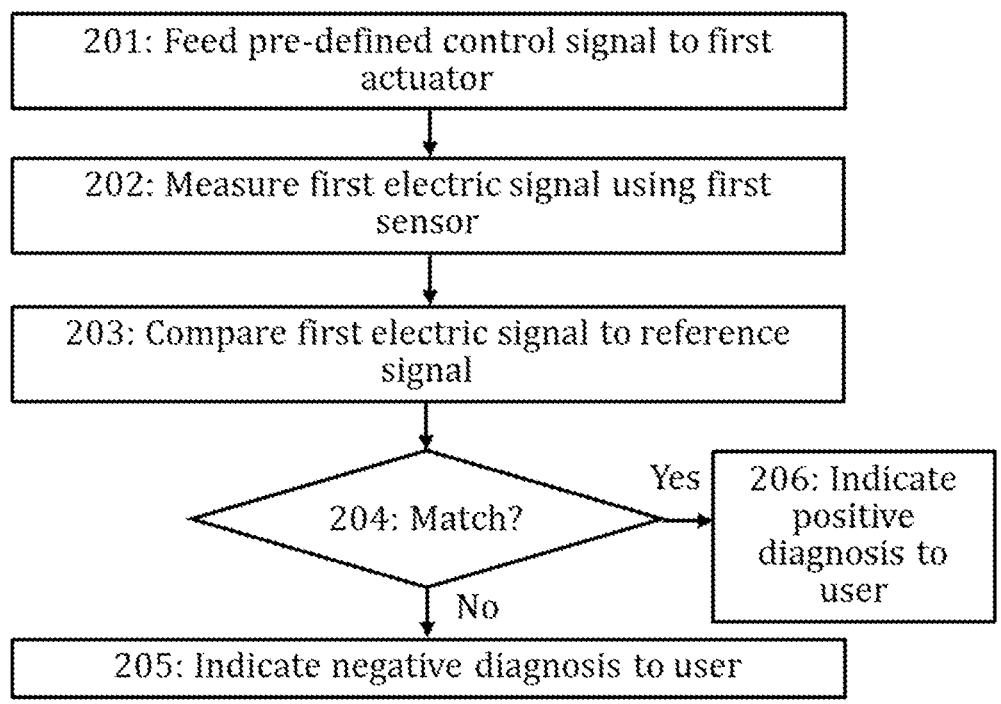
FIGS. 2 to 6, 7A and 7B illustrate exemplary processes according to embodiments.

FIG. 2 illustrates a process according to an embodiment for automatically diagnosing a mobile device. The illustrated process may be performed by a mobile device or specifically by the mobile device 101 of FIG. 1A or by the processing means 102 of the mobile device 101 of FIG. 1A. It is, however, assumed that the mobile device comprises at least one or more actuators and one or more sensors. The one or more actuators and the one or more sensors may be defined as described in relation to FIG. 1A. Optionally, the mobile device may also comprise a display (defined as described in relation to FIG. 1A). In this embodiment as well as in relation to the following illustrated embodiments, the entity performing the processes is simply a mobile device for brevity.

Referring to FIG. 2, the mobile device feeds, in block 201, a pre-defined control signal to a first actuator of the one or more actuators. In other words, the processing means of the mobile device provide as an output a pre-defined control signal which is fed to the first actuator for operating the first actuator. The first actuator may be a loudspeaker or a vibrator. It is assumed that the first actuator is of such type that there exists a sensor (a first sensor) of the mobile device which is capable of measuring a signal produced, at least in part, by the first actuator when driven by the pre-defined control signal (assuming non-faulty operation of the first actuator and the first sensor).

The pre-defined control signal may be defined in a variety of ways depending, for example, on the type of the first actuator. In some embodiments, the pre-defined control signal may be defined so that the feeding of the pre-defined control signal to the first actuator causes activating and deactivating the first actuator following a pre-defined pattern (if the first actuator is working correctly). For example, a vibrator may be operated in such a discrete manner. In other embodiments, the feeding of the pre-defined control signal to the first actuator causes producing an output having an amplitude directly proportional to an amplitude of the pre-defined control signal if the first actuator is working correctly. For example, a loudspeaker (or a more advanced vibrator) may be operated in such a continuous manner. In some embodiments, the pre-defined control signal is associated with a frequency or with two or more frequencies (i.e., the pre-defined control signal comprises a single frequency component or multiple frequency components). In some embodiments, the pre-defined control signal may have a definition which is unique for this particular mobile device. In the following two paragraphs, exemplary non-limiting operation specific to the type of the first actuator (vibrator or loudspeaker) is discussed.

If the first actuator is a vibrator, the vibrator or specifically the vibrator motor of the vibrator may be simply activated, in block 201, for a pre-defined amount of time by feeding the pre-defined control signal (e.g., a sine wave or a direct current signal) to the vibrator motor. To give an example of a more complicated pre-defined pattern for activating the vibrator motor, the vibrator motor may be first run for a first pre-defined amount of time (e.g., 100 ms), then stopped for a second pre-defined amount of time (e.g., 200 ms), and finally run for a third pre-defined amount of time (e.g., 50 ms). In some embodiments, the pre-defined pattern may be repeated one or more times. In some embodiments, the vibrator may be operated at two or more different vibration levels. In such embodiments, the feeding of the pre-defined control signal may result not only in activating and deactivating the vibrator following a pre-defined pattern, but also the intensity of the vibrations may be controlled in a pre-defined manner.

If the first actuator is a loudspeaker, the pre-defined control signal may be any pre-defined audio signal which when fed to the loudspeaker (that is, a functioning loudspeaker) produces a sound. The pre-defined audio signal may comprise, for example, a sine wave (i.e., a pure tone) corresponding to a pre-defined audio frequency (having pre-defined duration) or two or more sine waves each corresponding to a different pre-defined audio frequency. The two or more sine waves may be applied (or "played") simultaneously and/or in turn and may have equal or differing durations. In some embodiments, the pre-defined audio signal may correspond to a pre-defined test melody. In other embodiments, the pre-defined audio signal may comprise a plurality of audio frequencies spread out in frequency-domain so as to substantially cover the whole audible spectrum.

In response to the feeding in block 201, the mobile device measures or causes measuring, in block 202, a first electric signal using a first sensor of the one or more sensors. In other words, the measurement is carried out during the operation of the first actuator using the pre-defined control signal. The first sensor may be a microphone (if the first actuator is a loudspeaker) or an accelerometer or other vibration sensor (if the first actuator is a vibrator). As described above, ideally the first electric signal quantifies or represents (at least in part) the output produced by the first actuator. However, if the first actuator is faulty, no output (i.e., no sound or vibration) may have been produced by the first actuator and thus the measured first electric signal comprises only the background or ambient electric signal.

To determine whether the measured first electric signal has the correct (wave)form or shape and/or amplitude, the mobile device compares, in block 203, the first electric signal to a reference signal associated with the first actuator and the pre-defined control signal. The reference signal may be the pre-defined control signal fed to the first actuator or a signal calculated based on the pre-defined control signal (e.g., an envelope of the pre-defined control signal). In other embodiments, the reference signal may correspond to a signal measured using the first sensor in response to the first actuator being fed with the pre-defined control signal when the first actuator and the first sensor are known to operate as intended. Preferably, this reference measurement is also performed under ideal or close-to-ideal conditions (i.e., without significant background noise such as acoustic noise and/or vibration sources). In some embodiments, the reference signal may have been received, between blocks 201 and 202 or blocks 202 and 203, from a second terminal device which may have measured the reference signal using a first actuator of the second mobile device during the operation of the first actuator in block 201, as will be discussed in detail in relation to FIGS. 7A and 7B The comparing of the first electric signal to the reference signal in block 203 may comprise calculating a value of a similarity metric quantifying cross-correlation or similarity between the first electric signal and the reference signal. The similarity metric may be, for example, the (cross) correlation coefficient (or specifically the Pearson product-moment correlation coefficient) or a maximum value of cross-correlation calculated for the measured first electric signal and the reference signal. In some embodiments, the similarity metric may be defined simply by subtracting the first electric signal from the reference signal (or vice versa) and summing together the absolute values of all the resulting samples.

In some embodiments, the comparing in block 203 may be carried out in frequency-domain (instead of time-domain). In other words, the mobile device may convert, in block 203, at least the first electric signal to frequency-domain using one of discrete Fourier transform (DFT) and fast Fourier transform (FFT). The reference signal may also be converted to frequency-domain in a similar manner or a frequency-domain reference signal may be readily provided in the database.

In response to the first electric signal failing, in block 204, to match the reference signal according to one or more pre-defined criteria, the mobile device indicates, in block 205, a negative diagnosis (i.e., a diagnosis that at least one of the first actuator and the first sensor is not operating nominally) to a user of the mobile device using one or more of the display and the one or more actuators. The one or more pre-defined criteria may comprise, for example, a pre-defined threshold for the similarity metric (as defined above). Therefore, the matching between the first electric signal and the reference signal may be considered to fail if the value of the similarity metric is below a pre-defined threshold. The indication of the negative diagnosis using the display may comprise displaying a notification (e.g., a notification in a dedicated diagnosis application or a push notification) on the display. Information on the diagnosis (e.g., information on the affected actuator) may be provided to the user in the notification. The indicating of the negative diagnosis using the one or more actuators may comprise, for example, playing a pre-defined pure tone or melody using a (working) loudspeaker and/or vibrating the mobile device using a vibrator for a pre-defined amount of time.

In response to the first electric signal matching, in block 204, the reference signal according to the one or more pre-defined criteria, the mobile device indicates, in block 206, a positive diagnosis (i.e., a diagnosis that the first actuator and the first sensor are operating nominally) to a user of the mobile device using one or more of the display and the one or more actuators. The indicating may be carried out as described in the previous paragraph though the notification, pre-defined pure tone and/or melody may be different if no fault is detected.

In some embodiments, only one of the positive and negative diagnoses may be indicated to the user (as described in relation to blocks 205, 206). In other words, one of blocks 205, 206 may be omitted. For example, the mobile device may only indicate to the user if a fault in the operation of the mobile device is detected.

In some embodiments, the mobile device compares, in block 203, the first electric signal to one or more reference signals (preferably, two or more reference signals) associated with the first actuator and the pre-defined control signal. Each reference signal may be defined as discussed above. For example, two or more reference signals may have been received from a plurality of second mobile devices (as will be discussed in more detail in relation to FIGS. 7A and 7B). In embodiments where comparing is performed using two or more reference signals, the indicating of the negative diagnosis in block 205 may be triggered in block 204 according to the one or more pre-defined criteria only if the first electric signal fails to match any of the two or more reference signals. Conversely, the indicating of the positive diagnosis in block 206 may be triggered in block 204 according to the one or more pre-defined criteria if the first electric signal matches at least one of the two or more reference signals. In other embodiments, the indicating of the negative diagnosis in block 205 may be triggered in block 204 according to the one or more pre-defined criteria only if the first electric signal fails to match all of the two or more reference signals or a common reference signal formed by combining the two or more reference signals (if one has been generated). Conversely, the indicating of the positive diagnosis in block 206 may be triggered in block 204 according to the one or more pre-defined criteria if the first electric signal matches all of the two or more reference signals or a common reference signal formed by combining the two or more reference signals (if one has been generated).

Figure 3:
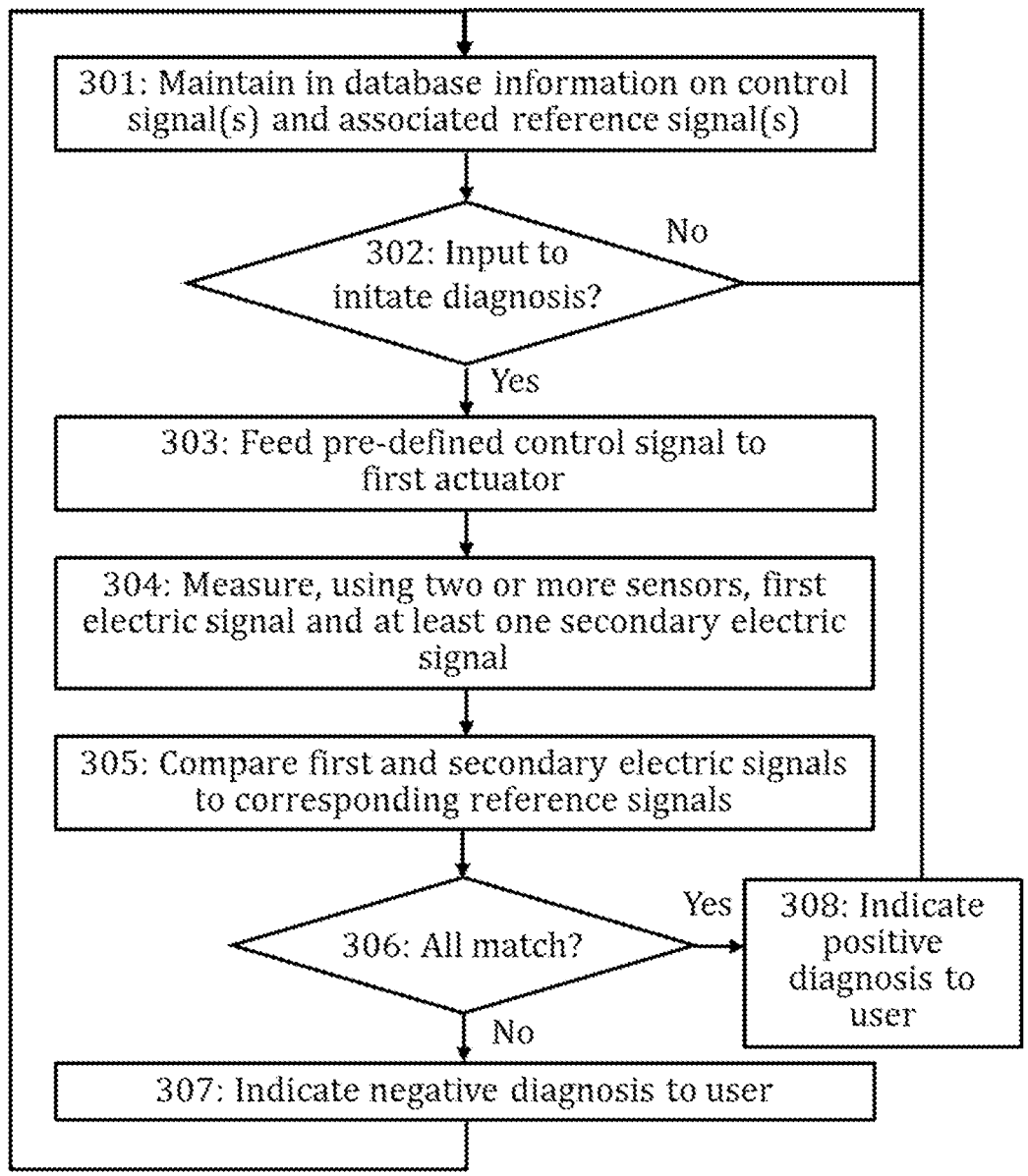

FIG. 3 illustrates another process according to an embodiment for automatically diagnosing a mobile device. The illustrated process may be performed by a mobile device or specifically by the mobile device 101 of FIG. 1A or by the processing means 102 of the mobile device 101 of FIG. 1A. Similar to the embodiment of FIG. 2, it is assumed that the mobile device comprises at least one or more actuators and one or more sensors. Optionally, the mobile device may also comprise a display (defined as described in relation to FIG. 1A).

In FIG. 3, it is initially assumed, in block 301, the mobile device maintains, in a database, information on one or more control signals and one or more associated reference signals. If the one or more reference signals are equal to the one or more reference signals, only the one or more control signals may be maintained in the database. The mobile device may further maintain, in the database, information on pre-defined criteria used in the diagnosis. The diagnosis process is initiated in block 302 when a pre-defined input is received from a user of the mobile device via a user input device (as described in relation to FIG. 1A). For example, the user may start the diagnosis using a dedicated diagnosis application installed to the mobile device. In other embodiments, the diagnosis process may be initiated automatically without human input.

Then, the mobile device feeds, in block 303, a pre-defined control signal to a first actuator using (as described in relation to block 201). However in this embodiment, the mobile device measures, in block 304, not only the first electric signal using a first sensor but also one or more secondary electric signals using one or more secondary sensors of the mobile device. The measurements using different sensors may be performed simultaneously or one after another (i.e., in sequence). The one or more secondary sensors may comprise at least one sensor of the same type as the first sensor. For example, sound produced by a loudspeaker may be measured by two or more microphones of the mobile device (i.e., the first sensor may be a first microphone and the one or more secondary sensor may comprise one or more secondary microphones). In other embodiments, the one or more secondary sensors may comprise at least one sensor of a different type compared to the first sensor.

The mobile device compares, in block 305, the first electric signal and the one or more secondary electric signals to corresponding reference signals, i.e., to a (first) reference signal (or in some embodiments, one or more reference signals) and one or more secondary reference signals, respectively. Each measurement by a different sensor may have a unique reference signal (which is maintained in the database) associated with the first actuator and the pre-defined control signal. In some embodiments, at least one of the reference signals may be used for the comparing with measurements by multiple sensors (e.g., by two or more microphones). The comparing for each measured electric signal-reference signal pair may be carried out as described in relation to block 203 of FIG. 2.

In response to at least one of the first and secondary electric signals failing, in block 306, to match the corresponding reference signals according to one or more pre-defined criteria, the mobile device indicates, in block 307, a negative diagnosis to the user of the mobile device using one or more of the display and the one or more actuators, as described in relation to block 205 of FIG. 2. In response to all of the first and secondary electric signals matching, in block 306, the corresponding reference signals according to one or more pre-defined criteria, the mobile device indicates, in block 308, a positive diagnosis, as described in relation to block 206 of FIG. 2. Each of the first electric signal and the one or more secondary electric signals may be evaluated in block 306 using a separate set of one or more pre-defined criteria. In other words, the first electric signal may be evaluated in block 306 (against a reference signal) according to one or more (primary) pre-defined criteria and each of the one or more secondary electric signals may be evaluated in block 306 (against a corresponding secondary reference signal) according to one or more secondary pre-defined criteria (which may be defined separately for each secondary electric signal).

In some embodiments where the first actuator is a first loudspeaker, two or more (secondary) microphones may be used, in block 304, for measuring two or more separate pre-defined audio signals playing at the same time. Each microphone may be used to measure a particular pre-defined audio signal associated with said microphone. The pre-defined audio signal transmitted through the first loudspeaker may comprise, in such embodiments, multiple audio signal components or multiple audio streams.

In some embodiments where the first actuator is a first vibrator, two or more (secondary) microphones of the mobile device may be used, in block 304, for measuring the sound resulting from the vibrating of the mobile device when the first vibrator is active. In an exemplary diagnosis scenario for such an embodiment, a vibrator may operate nominally and the one or more microphones may be able to capture the resulting audio signals, but the first accelerometer may be unable to detect any (significant non-ambient) movement of the mobile device. In such a case, a diagnosis that the first accelerometer is defective may be made. Similarly, in case all of the first accelerometer and the one or more microphones fail to measure any significant signals (that is, they measure only a background or ambient signal), it may be diagnosed that the first vibrator is defective. Further, in the case where the vibrator operates nominally and the first accelerometer detects the resulting movement of the mobile device, but all or some of the one or more microphones fail to measure any significant signals, it may be diagnosed that said all or some of the one or more microphones are defective.

Ideally, the diagnosis of the mobile device would be performed in a silent and/or vibration-free environment to allow for interference-free measurements. However, such an environment may not always be available and it would thus be beneficial if the diagnosis could also be performed dependably in a less-than-ideal environment plagued with background noise, background noise vibrations and/or signals from other mobile device running the diagnosis simultaneously. Three solutions for overcoming said problem according to embodiments are discussed in relation to FIGS. 4 to 6. The illustrated processes may be performed by a mobile device or specifically by the mobile device 101 of FIG. 1A or by the processing means 102 of the mobile device 101 of FIG. 1A. Specifically, FIG. 4 describes a process where the active actuator is a vibrator and FIG. 5 describes a process where the active actuator is a loudspeaker. Therefore, it is assumed that the mobile device carrying out the process of FIG. 4 comprises at least a vibrator and an accelerometer and the mobile device carrying out the process of FIG. 5 comprises at least a loudspeaker and a microphone. The mobile device carrying out the process of FIG. 6 may comprise at least either a vibrator and an accelerometer or a loudspeaker and a microphone. Optionally, the mobile device may also comprise a display (defined as described in relation to FIG. 1A). It should be noted that while the illustrated embodiments are based on the simpler embodiment of FIG. 2 for brevity, any of the additional features described in relation to FIG. 3 may also be combined with the embodiments illustrated in any of FIGS. 4 to 6.

Figure 4:
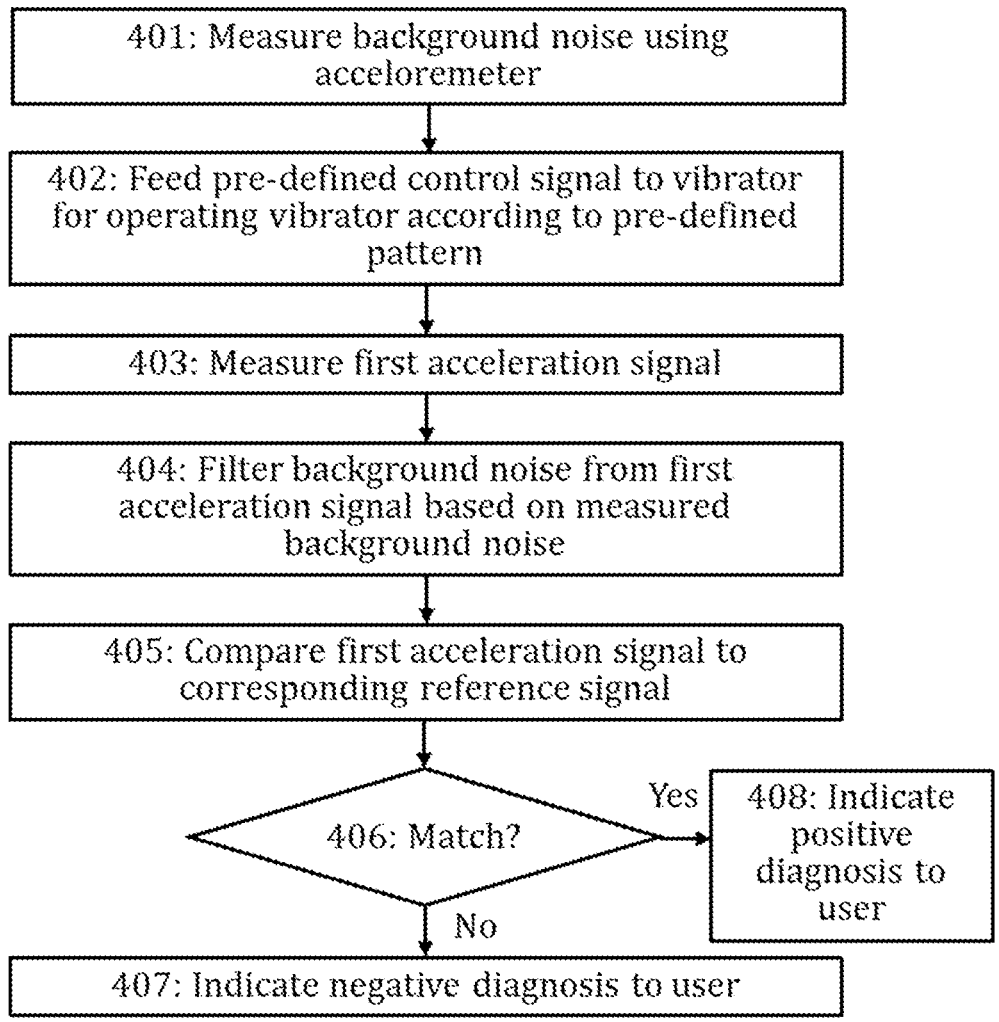

Referring to FIG. 4, the mobile device measures, in block 401, a background vibration signal, i.e., a signal quantifying background (noise) vibrations, using a first accelerometer when the vibrator is inactive. In other words, an electric signal provided by the first accelerometer when no vibrator (or other actuator) is engaged is recorded (and stored to the database). Thereafter, the mobile device feeds, in block 402, a pre-defined control signal to a first vibrator for causing the first vibrator to operate according to a pre-defined pattern and concurrently measures, in block 403, a first acceleration signal, similar to as described in relation to blocks 201, 202 of FIG. 2. This first acceleration signal may comprise a main signal component provided by the vibration due to the operation of the first vibrator and a background vibration signal component due to the background vibrations. The mobile device filters, in block 404, the first acceleration signal based on the measured background vibration signal so as to eliminate the background vibration component. The filtering may be carried out, for example, by converting the first acceleration signal and the background vibration signal to frequency-domain using, for example, FFT or DFT, subtracting the measured background vibration signal from the first acceleration signal in frequency-domain and optionally converting the resulting signal back to time-domain, for example, using IFFT or IDFT. Only then, the mobile device performs the actual diagnosis in blocks 405 to 408. Blocks 405 to 408 may be carried out as described in relation to blocks 203 to 206 of FIG. 2 (with the first acceleration signal being the first electric signal).

As described above, FIG. 5 illustrates a diagnosis process specifically for a (first) loudspeaker and a (first) microphone. The process of FIG. 5 starts similarly to the previous embodiment in that the mobile device initially measures, in block 501, a background or ambient audio signal, i.e., a signal quantifying background noise, using a first microphone when the first loudspeaker is inactive. The background noise may be equally called the ambient or residual noise. However, in this embodiment the information on the background noise is used in a different manner compared to the previous embodiment.

Figure 5:
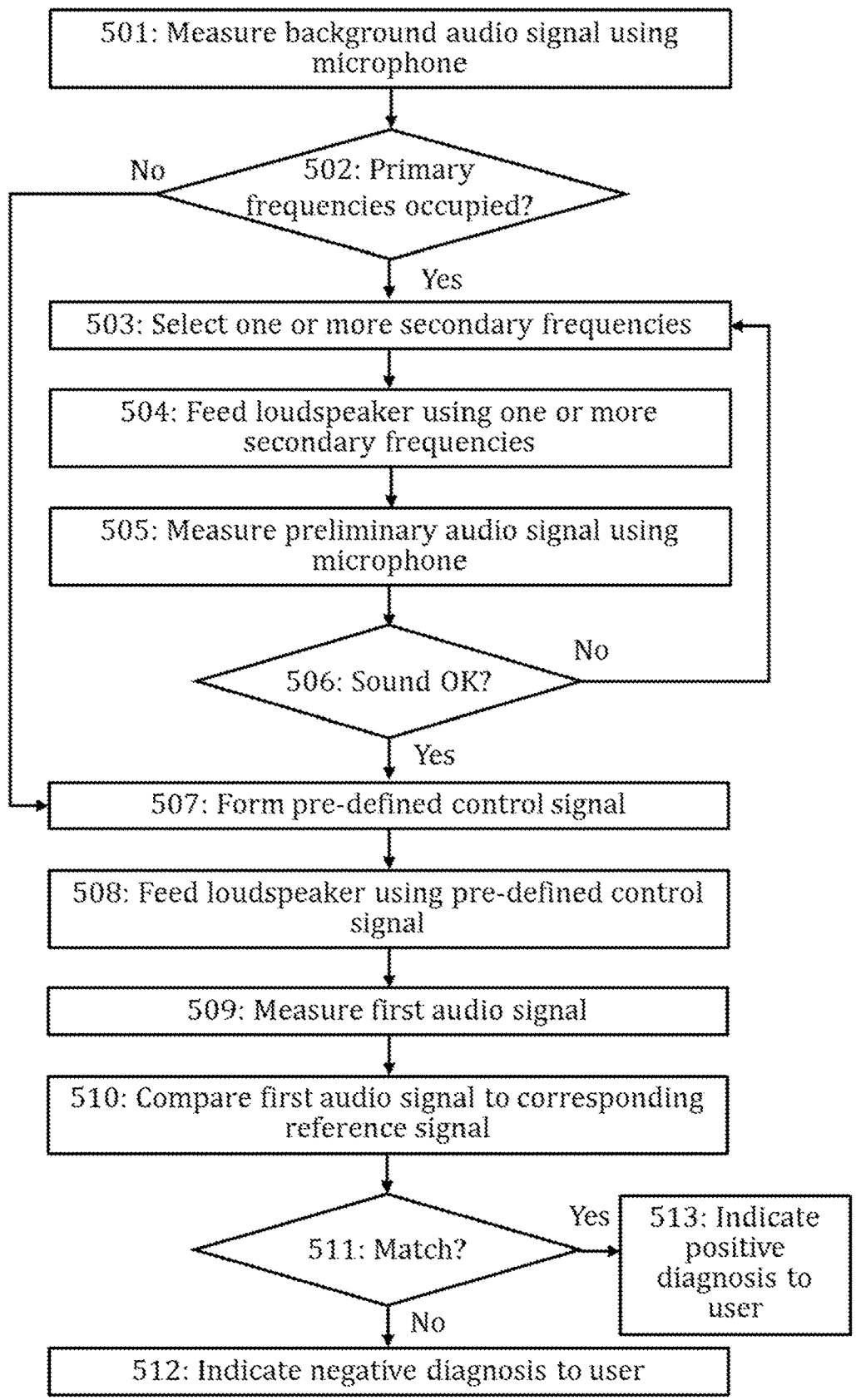

In FIG. 5, it is assumed that one or more primary frequencies and one or more secondary frequencies are defined (e.g., in the database). The one or more primary frequencies and the one or more secondary frequencies may specifically be audio frequencies. The one or more primary frequencies may be defined to be used for transmission via the first loudspeaker and reception via the first microphone (i.e., for performing measurement(s) according to the diagnosis process) by default or primarily while the one or more secondary frequencies provide alternative frequencies if any of the one or more primary frequencies cannot be used for transmission and/or reception. Specifically, it is determined, in block 502, by the mobile device based on the measured background audio signal whether the one or more primary frequencies are occupied. The determining in block 502 may comprise, for example, converting the measured background audio signal to frequency-domain (using, e.g., DFT or FFT) and comparing an amplitude or power level at the one or more primary frequencies to a pre-defined threshold defining a maximum value for an acceptable noise level. The pre-defined threshold may be defined to be the same or different for different primary frequencies.

In response to at least one primary frequency of the one or more primary frequencies being determined to be occupied in block 502, the mobile device selects, in block 503, for each occupied primary frequency, a secondary frequency of the one or more secondary frequencies determined to be unoccupied (i.e., free) based on the measured background audio signal.

After the one or more secondary frequencies have been selected in block 503, the mobile device may perform a preliminary test to determine that said one or more secondary frequencies are supported by the first microphone. To this end, the mobile device feeds, in block 504, a secondary pre-defined audio signal comprising the one or more secondary frequencies to the first loudspeaker and measures, in block 505, a preliminary audio signal using the first microphone during the operating of the first loudspeaker. It is determined in block 506 by the mobile device whether a sound (or a sufficiently loud sound) was measured by the first microphone at each of the one or more secondary frequencies, that is, whether the first microphone is capable of detecting sound at the at least one secondary (audio) frequency. This determining may comprise, for example, converting the measured preliminary audio signal to frequency-domain (using, e.g., DFT or FFT) and comparing an amplitude or power level at the one or more secondary frequencies to a pre-defined threshold defining a minimum value for an acceptable amplitude or power level.

If the first microphone is incapable of measuring sound at at least one selected secondary frequency, the mobile device repeats actions pertaining to blocks 503 to 506 for said at least one selected secondary frequency, that is, selects another at least one secondary frequency of the one or more secondary frequencies determined to be unoccupied to replace said at least one secondary frequency.

If each primary frequency is determined to be unoccupied in block 502 or if the first microphone is able to measure sound at each selected secondary frequency in block 506, the mobile device forms, in block 507, the pre-defined control signal. Specifically, the pre-defined control signal is formed in block 507 so that the pre-defined control signal comprises one or more frequencies determined to be unoccupied (i.e., one or more primary frequencies and/or one or more secondary frequencies). Thereafter, the mobile device carries out the diagnosis process in blocks 508 to 513 as described in relation to any previous embodiments. Specifically, blocks 508 to 513 may correspond to blocks 201 to 206 of FIG. 2 when the first actuator is assumed to be a loudspeaker and the first sensor to be a first microphone. The first loudspeaker (i.e., the first actuator) is fed in this case, in block 508, using the pre-defined audio signal (i.e., the pre-defined control signal) comprising the one or more frequencies determined to be unoccupied.

In some embodiments, the preliminary testing of selected one or more secondary frequencies may not be carried out, that is, blocks 504 to 506 may be omitted from the process. Instead, the one or more secondary frequencies selected in block 503 may be employed directly without any preliminary testing in block 507 for forming the pre-defined control signal.

In some embodiments, if it is determined, in block 503, that none of the one or more secondary frequencies are unoccupied (i.e., that no selection can be made), the mobile device may display an error message to the user of the mobile device via the display of the mobile device.

In some embodiments, the preliminary test (i.e., blocks 504 to 506) may be carried out for two or more microphones simultaneously or in sequence. The two or more microphones may comprise the first microphone and one or more secondary microphones used for the diagnosis, similar to as discussed in relation to FIG. 3.

Even though embodiments illustrated in FIGS. 4 and 5 were discussed above for specific combinations of an actuator and a sensor (i.e., a vibrator and an accelerometer and a microphone and a loudspeaker, respectively), said illustrated embodiments may be generalized for other actuator and sensor types. For example, the process of FIG. 4 may be applied for a combination of a microphone and a loudspeaker (instead of a vibrator and an accelerometer).

Figure 6:
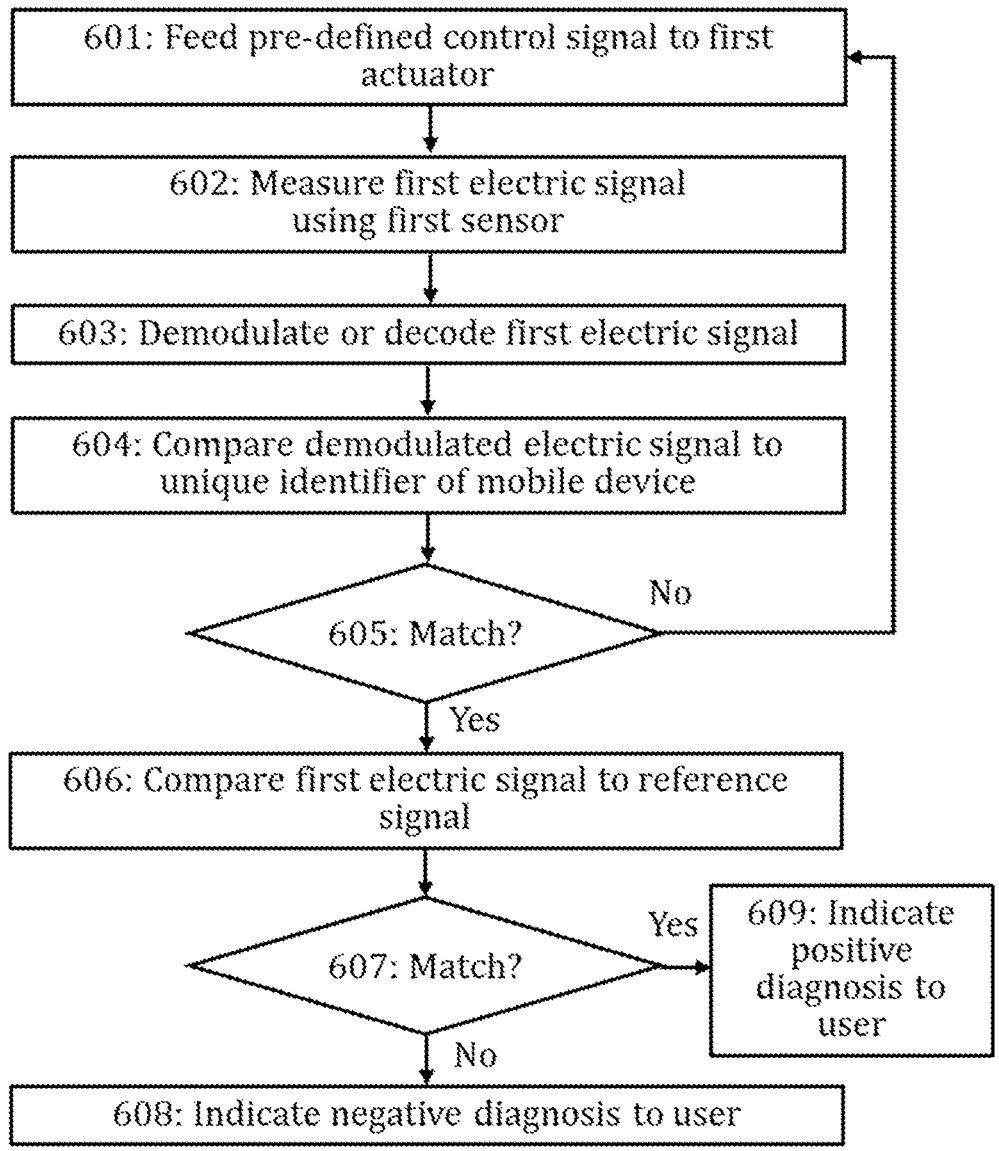

While the embodiments described in relation to FIGS. 4 and 5 employed a measurement of the background or ambient signal to minimize potential problems with the background noise interfering with diagnosis process, the embodiment of FIG. 6 tackles a related problem of how to avoid environmental noise (i.e., acoustic noise and/or noise vibrations) originating specifically from other mobile devices running the same diagnosis process without performing any measurements on the background or ambient signal. Similar to the process of FIG. 2, the mobile device feeds, in block 601, a pre-defined control signal to the first actuator (e.g., a first vibrator or a first microphone). However, the pre-defined control signal may be, in this embodiment, unique for this particular mobile device. Moreover, the pre-defined control signal may be a carrier signal which is modulated with a unique numeric or alphanumeric identifier of the mobile device.

If the first actuator is a first vibrator, the pre-defined control signal may be defined such that the periods of vibration (separated by periods without vibration) realize a unique Morse code corresponding to a unique numeric or alphanumeric identifier or other unique pre-defined pattern. In other words, the signal fed to the vibrator motor of the vibrator for providing vibration may be amplitude-modulated with the unique Morse code or other unique pre-defined pattern. The amplitude modulation may be two-level amplitude modulation where the modulated amplitude corresponds to zero (i.e., modulation index is equal to one) or to at least such a low signal level that the vibrator motor is not activated. The unique Morse code may correspond, for example, to the International Mobile Equipment Identity (IMEI) of the mobile device.

If the first actuator is a first microphone, the pre-defined control signal (i.e., the pre-defined audio signal) may correspond to an audio signal (e.g., a sine wave of a pre-defined frequency) which is modulated using a unique numerical identifier. Any known modulation technique based on, for example, modulating amplitude, phase and/or frequency may be employed. The unique numerical identifier may be, for example, the International Mobile Equipment Identity (IMEI) of the mobile device.

The mobile device may cause measuring, in block 602, a first electric signal using the first sensor (e.g., a first accelerometer or a first microphone), similar to as described in relation to above embodiments. However, after the measurement the mobile device demodulates or decodes, in block 603, the first electric signal and compares, in block 604, the demodulated first electric signal to the unique identifier of the mobile device (which may be maintained in the database). If it is determined in block 605 that the demodulated first electric signal fails to match the unique identifier of the mobile device, the mobile device may restart the whole process, i.e., perform again blocks 601 to 605, in an effort to measure correctly the signal produced by the first actuator.

While the analysis in blocks 603, 604 provides information on whether the measured first electric signal has the desired format, it may not provide in-depth quantitative information regarding, for example, signal quality and/or signal level of the measured signal and/or frequency-dependency of said quality and/or signal level (in the case of a measured audio signal). Therefore, even if the demodulated first electric signal matches the unique identifier of the mobile device, the first actuator (and/or the first sensor) may still be operating in a suboptimal manner. For that reason, in response to determining that the demodulated first electric signal matches the unique identifier of the mobile device, the mobile device may still carry out the "conventional" diagnosis process in blocks 606 to 609, similar to as described in relation to blocks 203 to 206 of FIG. 2.

In some embodiments, the result of the verification of the unique identifier in block 605 may serve as the (sole) diagnosis of the mobile device. In such embodiments, a positive match in block 605 may lead to the mobile device indicating a positive diagnosis to the user of the mobile device using the display of the mobile device and/or one or more actuators (block 609) and a negative match (i.e., no match) in block 605 may lead to the mobile device indicating a negative diagnosis to the user of the mobile device using the display of the mobile device and/or one or more actuators (block 608).

Figure 7A:
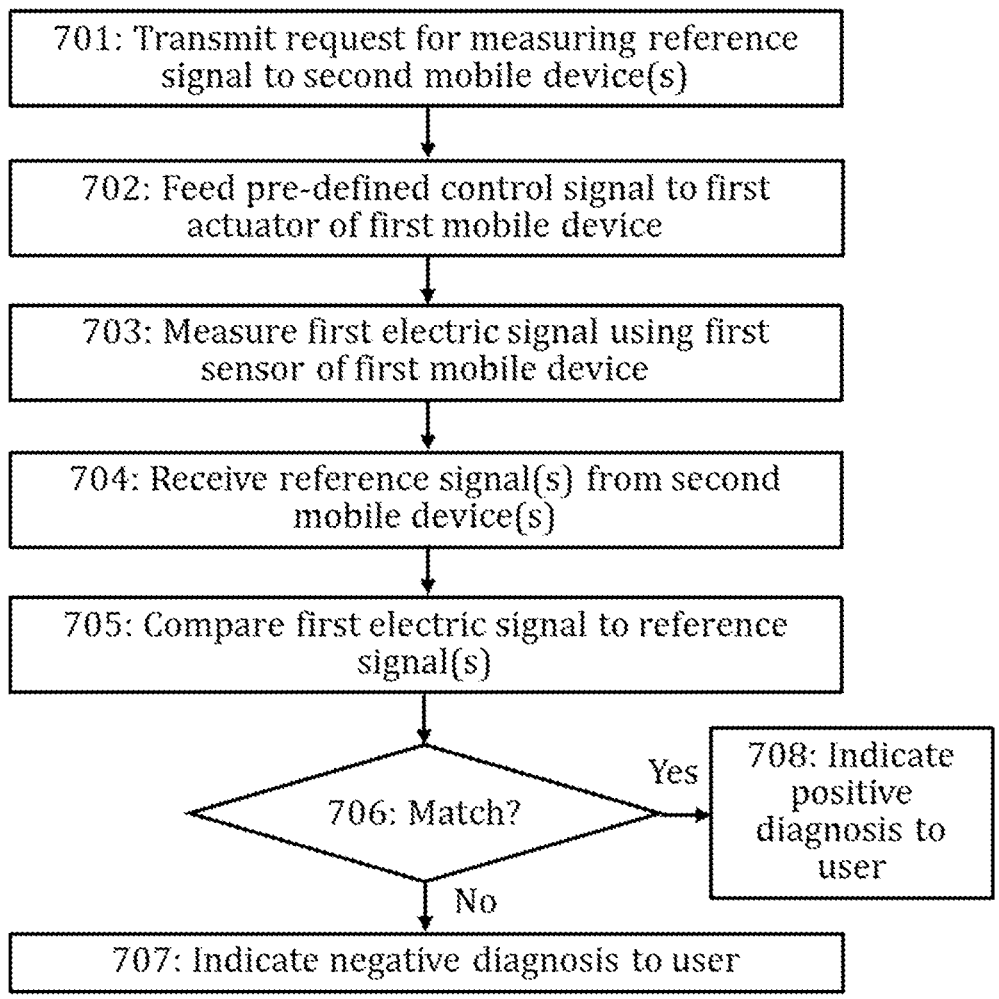
Figure 7B:
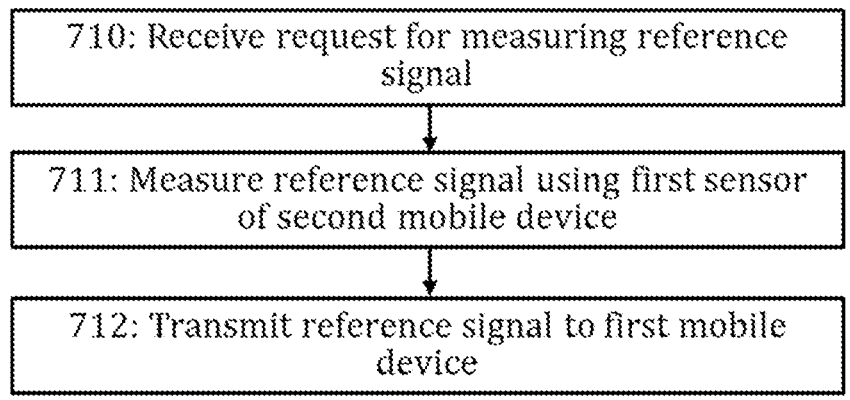

It is well-known that acoustical properties of a space (e.g., a room) affect the mechanical waves, such as sound and vibrations, traveling therein. For example, both the materials and geometry of the space affect how waves (e.g., acoustic waves) at certain frequencies are reflected, scattered and/or absorbed. Further, the medium filling the space, or part thereof, and its movement within the space, may affect the waveform. Thus, while the embodiments described in relation to FIGS. 4, 5 and 6 are designed to minimize potential problems with the background noise or the environmental noise originating from other mobile devices running the same diagnosis process, the embodiments illustrated with FIGS. 7A and 7B tackle a related problem of how to account for, at least partially, systematic distortion or error in the first electric signal measured by a mobile device originating from the acoustics of the space where the mobile device is located. Specifically, FIG. 7A illustrates a process performed by a first mobile device (i.e., a mobile device under analysis) and FIG. 7B illustrates a parallel process performed by a second mobile device (i.e., a mobile device for enabling analysis of the first mobile device and located in the same space as the first mobile device). The first and second mobile devices may be any mobile devices discussed in relation to above embodiments. Specifically, either or both of processes illustrated by FIGS. 7A and 7B may be performed by a mobile device 101 of FIG. 1A. The same mobile device according to embodiments may act as a first mobile device (equally called just a mobile device) in a first analysis process for analyzing itself and as a second mobile device (equally called a requesting mobile device) in another analysis process for analyzing another (first) mobile device. In the following, FIGS. 7A and 7B are discussed in parallel.

Referring to FIG. 7A, the first mobile device transmits, in block 701, a request for measuring a reference signal to one or more second mobile devices. The request for measuring the reference signal may comprise information on the first mobile device, the reference signal to be measured, which sensor should be used for the measurement and/or the time of the measurement. The one or more second mobile devices (or at least one of them) are located in close vicinity of the first mobile device (e.g., in the same space or room). Specifically, each of the one or more second mobile devices may be located at such a distance from the first mobile device that a signal generated by a first actuator of the first mobile device controlled by a pre-defined control signal is detectable by a first sensor of the second mobile device (said first sensor being a sensor capable of detecting signals generated by the first actuator of the first mobile device). Preferably, said detected signal should have considerably higher signal level (e.g., power level) compared to the noise floor measured by the second mobile device so that the signals may be detected with sufficiently high accuracy. In this embodiment, the first actuator of the first mobile device may be specifically a (first) loudspeaker and the first sensor of each of the first mobile device and the one or more second mobile devices may be a (first) microphone.

Similar to as discussed in relation to FIG. 6, the pre-defined control signal which is used by the first mobile device for driving the first actuator may be, also in this embodiment, unique for this particular mobile device. Specifically, the pre-defined control signal may be a carrier signal which is modulated with a unique (numeric or alphanumeric) identifier of the first mobile device so as to enable identifying, in the first mobile device and/or in any second mobile devices, that the correct signal has been measured. In such embodiments, the request may comprise information on said unique (numeric or alphanumeric) identifier and possibly on the modulation scheme. In other embodiments, another type of uniquely identifiable control signal may be employed. Also in these embodiments, the request may comprise information on a unique identifier associated with the pre-defined uniquely identifiable control signal.

Referring to FIG. 7B, the second mobile device (i.e., each of the one or more second mobile devices) receives, in block 710, the request for measuring a reference signal from the first mobile device. The second mobile device may store information comprised in the request to a database.

The request transmitted in block 701 of FIG. 7A and received in block 710 of FIG. 7B may be transmitted via one or more wireless communication links (e.g., using Bluetooth) between the first and second mobile devices. The request may be transmitted as unicast, multicast or broadcast transmission. The request may be transmitted via one or more (wireless) communications network which may, in some embodiments, comprise the Internet.

In some embodiments, each second mobile device may transmit, after block 710, a positive acknowledgment acknowledging the reception and acceptance of the request back to the first mobile device (not shown in FIG. 7B). Correspondingly, the first mobile may receive, after block 701, the acknowledgment (not shown in FIG. 7A). The transmission of the acknowledgment may be carried out via any transmission routes described in relation to transmission in block 701 (e.g., via one or more wireless communication links and/or networks).

In some embodiments, block 701 of FIG. 7A and block 710 of FIG. 7B may be omitted. For example, each second mobile device may be pre-configured to perform the measuring of the reference signal (e.g., by a user of the second mobile device or remotely by a (remote) computing device such as the computing device 194 of FIG. 1B).

Referring to FIG. 7A, the first mobile device feeds, in block 702, a pre-defined control signal to a first actuator of the one or more actuators of the first mobile device, similar to, e.g., block 201 of FIG. 2, block 303 of FIG. 3 and/or block 601 of FIG. 6. As mentioned also in relation to above embodiments, the pre-defined control signal may have a definition which is unique for this particular mobile device (i.e., for the first mobile device). Also similar to the earlier embodiments, in response to the feeding in block 702, the first mobile device measures or causes measuring, in block 703, a first electric signal using a first sensor of the one or more sensors of the first mobile device. In some embodiments, the first mobile device may perform the validation process discussed in relation to blocks 603 to 605 of FIG. 6 for the first electric signal directly after the measurement before moving on to a comparing stage so as to ensure that the correct signal has been measured.

In contrast to the earlier embodiments, the first mobile device is not, in this embodiment, the only mobile device performing measurements during the operation of the first actuator. Referring to FIG. 7B, the second mobile device (i.e., each of the one or more second mobile devices) measures, in block 711, a reference signal using a first sensor of the second mobile device. It may be assumed here that the second mobile device (or specifically the first sensor of the second mobile device) is known to be operating correctly and thus the measured reference signal is accurate (i.e., it is not deformed due to a faulty first sensor of the second mobile device). Upon performing the measuring in block 711, the second mobile device transmits (or causes transmitting), in block 712, information on the measured reference signal to the first mobile device (via said one or more wireless communications links between the first and second mobile devices).

In some embodiments, the second mobile device may, first upon measurement of the reference signal in block 711, check whether the measured signal corresponds to the signal defined in the received request, similar to as discussed in relation to blocks 603 to 605 of FIG. 6. Specifically, the second mobile device may demodulate or decode the measured reference signal. The demodulation may be carried out, e.g., based on information (e.g., a modulation scheme) included in the request received in block 710 and/or maintained in a database of the second mobile device. Then, the second mobile device may compare the demodulated or decoded signal to the unique identifier (e.g., a numeric or alphanumeric identifier) included in the request (i.e., to the unique identifier of the first mobile device). The transmission in block 712 in these embodiments may be triggered only in response to determining that the demodulated reference signal matches the unique identifier of the requesting mobile device.

Referring to FIG. 7A, the first mobile device receives, in block 704, at least one of the one or more reference signals from at least one of the one or more second mobile devices (via said one or more wireless communications links). In some embodiments, blocks 703, 704 may be carried out in reverse order or in parallel. Subsequently, the first mobile device compares, in block 705, said at least one received reference signal to the first electric signal. In some embodiments, the first mobile device may include in the comparing, in addition to said at least one received reference signal, a (pre-defined) reference signal maintained in a database of the first mobile device (as described, e.g., in relation to FIG. 3).

The comparing in block 705 may be carried out in frequency-domain, similar to block 203 of FIG. 2. In some embodiments, after receiving information on at least two reference signals in block 704, the first mobile device combines received signals to form a common reference signal, which is then compared to the first electric signal in block 705. Said common reference signal may be calculated, for example, as a weighted average of the one or more received reference signal, where the weights of the weighted average may depend at least on signal quality of the respective reference signal. Any measured reference signal which are detected to be clearly erroneous (e.g., detected to deviate significantly from the other reference signals) may be omitted from this analysis. 3. In other embodiments, the first electric signal may be compared separately to each of the one or more reference signals. The pre-defined criteria may specify that the first electric signal matches the one or more reference signals if the first electric signal matches any of the one or more reference signals (according to pre-defined criteria). Alternatively, the pre-defined criteria may specify that the first electric signal matches the one or more reference signals if the first electric signal matches all of the one or more reference signals (according to pre-defined criteria which may be defined separately for each reference signal).

In response to the first electric signal failing, in block 706, to match the one or more reference signals or a common reference signal (if one is generated) according to one or more pre-defined criteria, the mobile device indicates, in block 707, a negative diagnosis (i.e., a diagnosis that at least one of the first actuator and the first sensor of the first mobile device is not operating nominally) to a user of the mobile device using one or more of the display and the one or more actuators of the first mobile device, similar to as described in relation to above embodiments.

In response to the first electric signal matching, in block 706, the one or more reference signals according to the one or more pre-defined criteria, the mobile device indicates, in block 708, a positive diagnosis (i.e., a diagnosis that the first actuator and the first sensor are operating nominally) to a user of the mobile device using one or more of the display and the one or more actuators of the first mobile device, similar to as described in relation to above embodiments.

It is an advantage of this embodiment that the reference signal is specific to the space where the mobile devices (i.e., first and second mobile devices) are located, thus accounting for, at least partially, any systematic distortion or error superimposed as a common-mode signal, at least to some degree, in the first electric signal and each of the measured reference signals. For example, where the pre-defined control signal is a carrier signal modulated with a unique numeric or alphanumeric identifier of the mobile device (as described in relation to FIG. 6) the demodulated first electric signal may fail to match the unique identifier if the first electric signal is distorted due to acoustic effects, such as echoing, thus leading to a false negative diagnosis.

In some embodiments, the mobile device (or the first mobile device) may indicate the result of the diagnosis (a positive/negative diagnosis) using a display in a machine-readable format, in addition or alternative to a human-readable format. This functionality may be applied to any of the embodiments discussed above (e.g., specifically to any of blocks 205, 206 of FIG. 2, blocks 307, 308 of FIG. 3, blocks 407, 408 of FIG. 4, blocks 512, 513 of FIG. 5, blocks 608, 609 of FIG. 6 and blocks 707, 708 of FIG. 7A). In some embodiments, the mobile device (or the first mobile device) may transmit information on the result of the diagnosis (a positive/negative diagnosis) to a computing device (e.g., a computing device as discussed in relation to FIG. 1B) via a wired or wireless communications link. Said computing device may act as a central monitoring entity for monitoring the diagnosis processes carried out by a plurality of mobile devices simultaneously. Additionally or alternatively, the first mobile device may transmit information on any intermediate processes and their outcomes to said computing device via said wired or wireless communications link (possibly in real time). For example, information on any measured signals and/or a failure of a diagnosis process may be communicated to the computing device. Corresponding information may be transmitted to the computing device also by each second mobile device as discussed in relation to FIG. 7B. In general, information on any processes illustrated in FIGS. 2 to 6, 7A and 7B may be transmitted to the computing device to facilitate the monitoring. In some embodiments, the computing device may be configured to directly measure at least some signals produced by at least some of the actuators of the mobile devices connected to it.

The blocks, related functions, and information exchanges described above by means of FIGS. 2 to 6, 7A and 7B in no absolute chronological order, and some of them may be performed simultaneously or in an order differing from the given one. Other functions can also be executed between them or within them, and other information may be sent, and/or other rules applied. Some of the blocks or part of the blocks or one or more pieces of information can also be left out or replaced by a corresponding block or part of the block or one or more pieces of information.

Embodiments as described above may be carried out in the form of a computer process defined by a computer program or portions thereof. Embodiments of the methods described in connection with FIGS. 2 to 6, 7A and 7B may be carried out by executing at least one portion of a computer program comprising corresponding instructions. The computer program may be provided as a computer readable medium comprising program instructions stored thereon or as a non-transitory computer readable medium comprising program instructions stored thereon. The computer program may be in source code form, object code form, or in some intermediate form, and it may be stored in some sort of carrier, which may be any entity or device capable of carrying the program (e.g., a mobile device as discussed in relation to embodiments). For example, the computer program may be stored on a computer program distribution medium readable by a computer or a processor. The computer program medium may be, for example but not limited to, a record medium, computer memory, read-only memory, electrical carrier signal, telecommunications signal, and software distribution package, for example. The computer program medium may be a non-transitory medium. Coding of software for carrying out the embodiments as shown and described is well within the scope of a person of ordinary skill in the art.

Even though the embodiments have been described above with reference to examples according to the accompanying drawings, it is clear that the embodiments are not restricted thereto but can be modified in several ways within the scope of the appended claims. Therefore, all words and expressions should be interpreted broadly and they are intended to illustrate, not to restrict, the embodiment. It will be obvious to a person skilled in the art that, as technology advances, the inventive concept can be implemented in various ways. Further, it is clear to a person skilled in the art that the described embodiments may, but are not required to, be combined with other embodiments in various ways.

The invention claimed is:

1. A method for self-diagnosing a mobile device comprising at least one or more actuators, one or more sensors and a display, the method comprising:
feeding a pre-defined control signal to a first actuator of the mobile device;
measuring, in response to the feeding, a first electric signal using a first sensor of the one or more sensors;
comparing the first electric signal to one or more reference signals associated with the first actuator and the pre-defined control signal;
indicating, in response to the first electric signal failing to match the one or more reference signals according to one or more pre-defined criteria, a negative diagnosis to a user of the mobile device using one or more of the display of the mobile device and the one or more actuators of the mobile device; and one of:
feeding of the pre-defined control signal to the first actuator causes activating and deactivating the first actuator following a pre-defined pattern if the first actuator is working correctly or causes producing an output having an amplitude directly proportional to an amplitude of the pre-defined control signal if the first actuator is working correctly; or
performing, in response to receiving a request for measuring a reference signal with one of the one or more sensors from a requesting mobile device, the following:
measuring a reference signal using said one of the one or more sensors according to the request; and
transmitting information on the measured reference signal to the requesting mobile device, wherein the request for measuring the reference signal comprises at least information on a unique identifier of the requesting mobile device, the method further comprising performing, in response to receiving the request for measuring the reference signal, the following:
demodulating, in response to the measuring of the reference signal, the reference signal;
comparing the demodulated reference signal to the unique identifier of the requesting mobile device; and
performing the transmitting of the information on the measured reference signal only in response to determining that the demodulated reference signal matches the unique identifier of the requesting mobile device.

2. The method according to claim 1, further comprising: indicating, in response to the first electric signal matching the one or more reference signals according to the one or more pre-defined criteria, a positive diagnosis to a user of the mobile device using one or more of the display and the one or more actuators.

3. The method according to claim 1, wherein the pre-defined criteria specify that the first electric signal matches the one or more reference signals if the first electric signal matches any of the one or more reference signals or the pre-defined criteria specify that the first electric signal matches the one or more reference signals if the first electric signal matches all of the one or more reference signals.

4. The method according to claim 1, further comprising: receiving, after the feeding and before the comparing, information on the one or more reference signals measured by one or more second mobile devices during the feeding of the pre-defined control signal to the first actuator from the one or more second mobile devices.

5. The method according to claim 4, further comprising: transmitting, before the feeding, a request for measuring a reference signal during the feeding of the pre-defined control signal to the first actuator to the one or more second mobile devices.

6. The method according to claim 4, further comprising: in response to the one or more reference signals consisting of two or more reference signals, combining said two or more reference signal to form a common reference signal and performing the comparing between the first electric signal and the common reference signal.

7. The method according to claim 1, wherein the one or more reference signals comprise the pre-defined control signal or a signal calculated based on the pre-defined control signal.

8. The method according to claim 1, wherein the pre-defined control signal corresponds to a carrier signal modulated with a unique identifier of the mobile device and the mobile device further comprises: demodulating, in response to the measuring of the first electric signal, the first electric signal; comparing the demodulated first electric signal to the unique identifier of the mobile device; and performing the comparing of the first electric signal to the one or more reference signals only in response to determining that the demodulated first electric signal matches the unique identifier of the mobile device.

9. The method according to claim 1, wherein the first actuator is a first loudspeaker and the pre-defined control signal is a pre-defined audio signal and the feeding of the pre-defined control signal to the first actuator comprises feeding a pre-defined audio signal to the first loudspeaker for producing a sound or the first actuator is a first vibrator and the feeding of the pre-defined control signal to the first actuator comprises feeding the predefined control signal to the first vibrator for causing vibration of the first vibrator and as a consequence of the mobile device.

10. The method according to claim 1, further comprising: measuring, in response to the feeding, a secondary electric signal using each of at least one secondary sensor of the one or more sensors; comparing each secondary electric signal to a secondary reference signal associated with the first actuator and the pre-defined control signal; indicating, in response to one or more secondary electric signals failing to match a corresponding secondary reference signal according to one or more secondary predefined criteria, a negative diagnosis to a user of the mobile device using one or more of the display and the one or more actuators; and indicating a positive diagnosis to a user of the mobile device using one or more of the display and the one or more actuators only in response to the first electric signal matching the one or more reference signals according to the one or more pre-defined criteria and each of the one or more secondary electric signals matching the respective one or more secondary reference signals according to the one or more secondary pre-defined criteria.

11. The method according to claim 10, wherein at least one sensor of the at least one secondary sensor is a sensor of a different type compared to the first sensor.

12. The method according to claim 1, wherein the one or more reference signals consist of a reference signal, the comparing of the first electric signal to the reference signal comprises calculating a value of a similarity metric quantifying correlation or similarity between the first electric signal and the reference signal and the first electric signal is determined to fail to match the reference signal according to the one or more pre-defined criteria in response to the value of the similarity metric being below a pre-defined threshold.

13. The method according to claim 1, wherein the first actuator is a first loudspeaker, the first sensor is a first microphone, the pre-defined control signal is an audio signal and the method further comprises performing before the feeding of the predefined control signal: measuring a background audio signal using the first microphone when the first loudspeaker is inactive; determining based on the measured background audio signal whether one or more primary frequencies primarily used for transmission via the first loudspeaker and for reception via the first microphone are occupied; selecting, in response to at least one primary frequency of the one or more primary frequencies being determined to be occupied, a secondary frequency determined to be unoccupied for each of said at least one primary frequency determined to be occupied based on the measured background audio signal; and forming the pre-defined control signal, wherein the pre-defined control signal is formed so as to comprise one or more frequencies determined to be unoccupied.

14. The method according to claim 13, further comprising performing before the forming of the pre-defined control signal: performing, in response to the selecting of the one or more secondary frequencies, a preliminary test by feeding a secondary pre-defined audio signal comprising the one or more secondary frequencies to the first microphone, measuring a preliminary audio signal using the first microphone and determining based on the preliminary audio signal whether the first microphone is capable of detecting sound at the at least one secondary frequency; and selecting, in response to the first microphone being incapable of detecting sound at the at least one secondary frequency, another at least one secondary frequency determined to be unoccupied to replace the at least one secondary frequency.

15. The method according to claim 1, wherein the first actuator is a first vibrator and the first sensor is a first accelerometer and the method further comprises: measuring a background vibration signal using the first accelerometer when the first vibrator is inactive; filtering, in response to the measuring of the first electric signal, the first electric signal based on the measured background vibration signal; and performing the comparing using the filtered first electric signal.

16. The method according to claim 1, wherein the one or more sensors comprise one or more of a microphone and an accelerometer and the one or more actuators comprise one or more of a loudspeaker and a vibrator.

17. A mobile device comprising:
one or more sensors;
one or more actuators;
a display;
means for feeding a pre-defined control signal to a first actuator of the one or more actuators;
means for measuring, in response to the feeding, a first electric signal using a first sensor of the one or more sensors; means for comparing the first electric signal to one or more reference signals associated with the first actuator and the pre-defined control signal;
means for indicating, in response to the first electric signal failing to match the one or more reference signals according to one or more pre-defined criteria, a negative diagnosis to a user of the mobile device using one or more of the display and the one or more actuators; and
wherein the first actuator is a first vibrator and the first sensor is a first accelerometer and the mobile device further comprises means for:
measuring a background vibration signal using the first accelerometer when the first vibrator is inactive;
filtering, in response to the measuring of the first electric signal, the first electric signal based on the measured background vibration signal; and
performing the comparing using the filtered first electric signal.

18. The mobile device of claim 17, wherein the means for the feeding, the measuring, the comparing and the indicating comprise: at least one processor; and at least one memory including computer program code.

19. A computer readable medium comprising program instructions stored thereon for performing at least the following:
- causing feeding a pre-defined control signal to a first actuator of a mobile device, the first actuator comprising a first vibrator;
- causing measuring, in response to the feeding, a first electric signal using a first sensor of the mobile device, the first sensor comprising a first accelerometer;
- comparing the first electric signal to one or more reference signals associated with the first actuator and the pre-defined control signal;
- indicating, in response to the first electric signal failing to match the one or more reference signals according to one or more pre-defined criteria, a negative diagnosis to a user of the mobile device using one or more of a display of the mobile device and one or more actuators of the mobile device;
- measuring of a background vibration signal using the first accelerometer when the first vibrator is inactive;
- filtering, in response to the measuring of the first electric signal, the first electric signal based on the measured background vibration signal; and
- performing the comparing using the filtered first electric signal.

* * * * *